United States Patent
Chung et al.

(10) Patent No.: US 7,324,369 B2
(45) Date of Patent: Jan. 29, 2008

(54) MRAM EMBEDDED SMART POWER INTEGRATED CIRCUITS

(75) Inventors: Young Sir Chung, Chandler, AZ (US); Robert W. Baird, Gilbert, AZ (US); Mark A. Durlam, Chandler, AZ (US); Gregory W. Grynkewich, Gilbert, AZ (US); Eric J. Salter, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 142 days.

(21) Appl. No.: 11/170,874

(22) Filed: Jun. 30, 2005

(65) Prior Publication Data
US 2007/0002609 A1 Jan. 4, 2007

(51) Int. Cl.
*G11C 11/00* (2006.01)
(52) U.S. Cl. .......................... 365/158; 365/226
(58) Field of Classification Search ................ 365/158, 365/226; 257/E21.665
See application file for complete search history.

(56) References Cited
U.S. PATENT DOCUMENTS
5,940,319 A 8/1999 Durlam et al.
6,771,538 B2 8/2004 Shukuri et al.
6,925,000 B2 * 8/2005 Sussner ...................... 365/158
2004/0207035 A1 10/2004 Witcraft et al.

* cited by examiner

*Primary Examiner*—Huan Hoang
(74) *Attorney, Agent, or Firm*—Ingrassia, Fisher & Lorenz, P.C.

(57) ABSTRACT

An integrated circuit device includes a magnetic random access memory ("MRAM") architecture and a smart power integrated circuit architecture formed on the same substrate using the same fabrication process technology. The fabrication process technology is a modular process having a front end process and a back end process. In the example embodiment, the smart power architecture includes a power circuit component, a digital logic component, and an analog control component formed by the front end process, and a sensor architecture formed by the back end process. The MRAM architecture includes an MRAM circuit component formed by the front end process and an MRAM cell array formed by the back end process. In one practical embodiment, the sensor architecture includes a sensor component that is formed from the same magnetic tunnel junction core material utilized by the MRAM cell array. The concurrent fabrication of the MRAM architecture and the smart power architecture facilitates an efficient and cost effective use of the physical space available over active circuit blocks of the substrate, resulting in three-dimensional integration.

14 Claims, 3 Drawing Sheets

MRAM EMBEDDED SMART POWER INTEGRATED CIRCUITS

TECHNICAL FIELD

The present invention relates generally to electronic devices. More particularly, the present invention relates to an integrated circuit device that includes a magnetoresistive random access memory ("MRAM") architecture and a smart power architecture formed on a single substrate.

BACKGROUND

MRAM is a nonvolatile memory technology that uses magnetic polarization to store data, in contrast to other RAM technologies that use electronic charges to store data. One primary benefit of MRAM is that it retains the stored data in the absence of applied system power, thus, it is a nonvolatile memory. Generally, MRAM includes a large number of magnetic cells formed on a semiconductor substrate, where each cell represents one data bit. Information is written to a cell by changing the magnetization direction of the magnetic free layer within the cell, and a bit is read by measuring the resistance of the cell (low resistance typically represents a "0" bit and high resistance typically represents a "1" bit).

An MRAM device generally includes an array of cells that are interconnected using conductive bit lines, conductive digit lines, and/or local interconnects and the like. Practical MRAM devices are fabricated using known semiconductor process technologies. For example, the bit and digit lines are formed from different metal layers, which are separated by one or more insulating and/or additional metal layers. Conventional fabrication processes allow distinct MRAM devices to be easily fabricated on a devoted substrate.

Smart power integrated circuits are single-chip devices that are capable of generating and providing operating power in a controlled and intelligent manner. Smart power integrated circuits typically include a power circuit component, an analog control component, and a digital logic component. Smart power integrated circuits may also include one or more sensors that are utilized to control the output power in response to changing operating conditions. For example, in-cell phones, smart power products can be engineered to regulate power consumption, amplify audio signals, and supply power to color screens. In inkjet printers, smart power products can help drive the motors and fire the nozzles for ink delivery. In automobiles, smart power products can help control engine and braking systems, airbag deployments, and seat positioning.

The miniaturization of many modern applications make it desirable to shrink the physical size of electronic devices, integrate multiple components or devices into a single chip, and/or improve circuit layout efficiency. It is desirable to have a semiconductor-based device that includes an MRAM architecture integrated with a smart power architecture on a single substrate, where the MRAM architecture and the smart power architecture are fabricated using the same process technology. It is also desirable to have a semiconductor-based device that includes an MRAM architecture integrated with a sensor component on a single substrate, where the MRAM architecture and the sensor component are fabricated using the same process technology. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques and features related to MRAM design, MRAM operation, semiconductor device fabrication, and other aspects of the integrated circuit devices may not be described in detail herein. Furthermore, the circuit/component layouts and configurations shown in the various figures contained herein are intended to represent example embodiments of the invention. It should be noted that many alternative or additional circuit/component layouts may be present in a practical embodiment.

The following description may refer to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically.

A practical MRAM architecture can be formed on a substrate using a suitable semiconductor fabrication process. In practice, MRAM structures described herein can be formed using a conventional MRAM fabrication process. A practical MRAM device will typically include millions of cells. Generally, an MRAM architecture includes at least one digit line formed from one metal layer, at least one bit line formed from another metal layer, and a magnetic tunnel junction ("MTJ") core formed between the two metal layers. The MTJ core includes cells that form an array of memory locations for the MRAM architecture.

Figure 1:
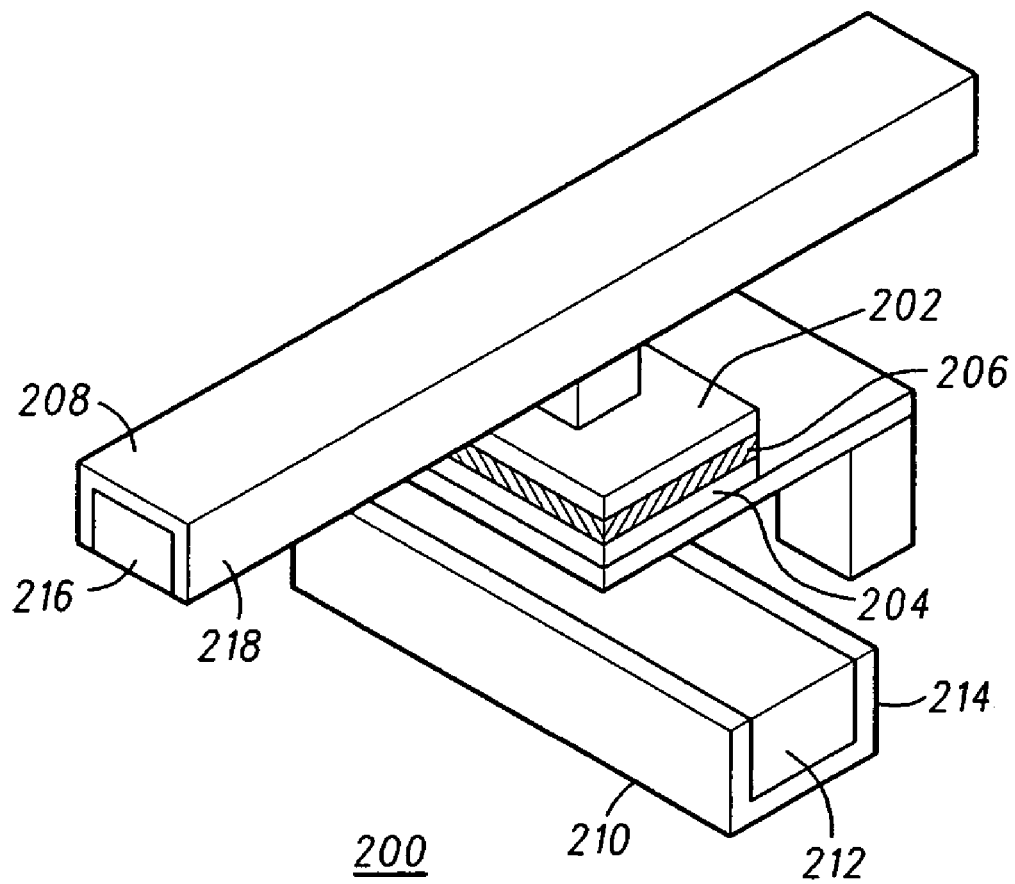
FIG. 1 is a schematic perspective view of an MRAM cell configured in accordance with an example embodiment of the invention.

FIG. 1 is a schematic perspective view of an MRAM cell 200 configured in accordance with an example embodiment of the invention. Each cell in an MRAM architecture may be configured as shown in FIG. 1. MRAM cell 200 generally includes either an upper ferromagnetic or synthetic antiferromagnetic ("SAF") layer 202, or a lower ferromagnetic or SAF layer 204, and a tunnel barrier layer 206 between the two ferromagnetic layers. In this example, the upper ferromagnetic or SAF layer 202 composes the free magnetic layer because the direction of its magnetization can be switched to change the bit status of cell 200. Lower ferromagnetic or SAF layer 204, however, is the fixed magnetic layer because the direction of its magnetization is pinned in one direction and does not change direction of polarization during normal operating conditions. When the magnetization in upper ferromagnetic or SAF layer 202 is parallel to the magnetization in lower ferromagnetic layer 204, the resistance across cell 200 is in its low resistance state. When the magnetization in upper ferromagnetic layer 202 is antiparallel to the magnetization in lower ferromagnetic layer 204, the resistance across cell 200 is in its high resistance state. The data ("0" or "1") in a given cell 200 is read by measuring the resistance of the cell 200. The techniques utilized to read and write data to MRAM cell 200 are known to those skilled in the art and, therefore, will not be described in detail herein.

FIG. 1 also depicts a bit line 208 and a digit line 210 (individually and collectively referred to herein as "program lines") corresponding to cell 200. The orientation of the magnetization in free magnetic layer 202 rotates in response to applied current pulses from the digit and bit lines for toggle applications and makes a complete 180 degree reversal when both digit and bit line pulses are applied simultaneously for the single magnetic free layer (or conventional) application. In a typical non-toggle MRAM, the orientation of the bit is switched by reversing the polarity of the current in bit line 208 while keeping a constant polarity of the current in digit line 210. In a practical deployment, bit line 208 may be connected to any number of similar NRAM cells (e.g., a column of cells) to provide a common write current to each of the connected cells. Similarly, digit line 210 may be associated with any number of similar MRAM cells (e.g., a row of cells) to provide a common digit current to each of the cells.

In the preferred embodiment shown in FIG. 1, digit line 210 includes a conductive digit element 212 and a permeable cladding material 214 formed from a soft magnetic material. In this example, cladding 214 partially surrounds conductive element 212. In particular, cladding 214 is formed around three sides of conductive element 212 such that the upward facing surface of conductive element 212 remains uncladded. In the preferred embodiment shown in FIG. 1, line 208 includes a conductive bit element 216 and cladding 218 formed from a permeable magnetic material. In this example, cladding 218 partially surrounds conductive element 216. In particular, cladding 218 is formed around three sides of conductive element 216 such that the downward facing surface of conductive element 216 remains uncladded. Cladding 214/218 may be utilized to focus the magnetic flux toward the MTJ to improve the efficiency of programming. The cladding has an additional benefit of reducing the write disturbance to neighboring bits. In practical embodiments, the magnetic cladding is an integral part of the barrier layers used in the fabrication of copper program lines used in the MRAM process.

In practical embodiments, conductive element 212 and conductive element 216 are formed from an electrically conductive material such as copper, and cladding 214/218 is formed from a soft, permeable magnetic material such as NiFe, a nickel-iron-cobalt alloy, a cobalt-iron alloy, or the like. In one example embodiment, cladding 214/218 is approximately 200 Angstroms thick (the sidewalls of cladding 214/218 may be slightly thinner). Although the conductive elements and the cladding are realized from different materials, conductive element 212 and cladding 214 are considered to be fabricated at one common metal layer (e.g., the metal four layer), and conductive element 216 and cladding 218 are considered to be fabricated at another common metal layer (e.g., the metal five layer).

The terms "first metal layer" and "second metal layer" may be used herein to differentiate between any two distinct metal layers, and "first metal layer" and "second metal layer" need not indicate the metal one and metal two layers, respectively. In other words, a "first metal layer" means any metal layer within a described integrated circuit device, regardless of any arbitrary layer numbering scheme, and a "second metal layer" means any other metal layer within the described integrated circuit device, regardless of any arbitrary layer numbering scheme.

Smart power integrated circuits can be fabricated using a combinational CMOS process that integrates precision analog, power devices, and logic or a subset of the blocks. Smart power integrated circuits can reduce various components and combine all those functions into a single cost-effective IC including functions of voltage regulation, power MOSFETs, input signal conditioning, transient protection, system diagnostics, and control. ICs using smart power integrated circuits contain various functions, such as power ICs, communication, power management, safety and sensors, and many other special functions. Smart power integrated circuits feature a rich set of mixed signal building blocks including A/D and D/A converters, rail-to-rail op amps, comparators, charge pumps and gate drives, voltage regulators, precision references, digital logic, and non-volatile memory. For driving loads there are power MOSFET devices with inductive energy clamps, independent thermal management, short circuit protection, and diagnostic load sensing.

Figure 2:
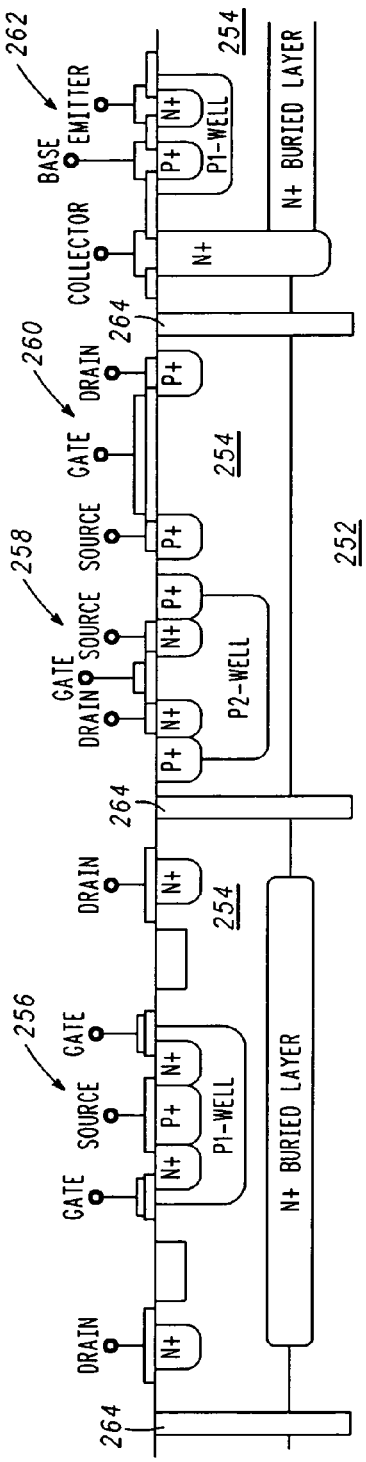
FIG. 2 is a schematic sectional view of a simplified smart power integrated circuit architecture.

FIG. 2 is a schematic view of a simplified smart power integrated circuit architecture 250, which, as an example, is formed on a substrate 252 with an n-epi layer 254 using a suitable semiconductor fabrication process. Smart power integrated circuits can be formed on various types of substrates with and/or without epitaxial layers, employing n-type or p-types. In practice, smart power integrated circuit architecture 250 and other structures described herein can be formed using any suitable integrated circuit fabrication process. Although smart power integrated circuit architecture 250 is depicted with power MOSFET 256, CMOS (n-MOSFET 258 and p-MOSFET 260), and bipolar devices 262, a practical smart power integrated circuit will typically include various active and passive components, such as diodes, resistors, capacitors, inductors, fuses, anti-fuses, and memory devices. Generally, smart power integrated circuit architecture 250 includes at least one metal layer, and additional metal layers are added to increase the circuit density and to enhance circuit performance. Various n-type and p-types wells are formed using well-known semiconductor processing, such as implantation and diffusion. Isolation components 264 could be realized using oxidation and or trench process.

The invention relates to an integrated circuit device formed on a common substrate and having an MRAM architecture combined with a smart power architecture, where at least a portion of the MRAM architecture and at least a portion of the smart power architecture are concurrently formed by the same fabrication process. As used herein, a smart power architecture includes a power circuit component configured to manage electrical power and at least one additional component configured to control, regulate, monitor, affect, or react to the operation of the power circuit. In practice, the power circuit component may include power transistors, and the at least one additional component may include, without limitation: a sensor (e.g., an environmental condition sensor, an electromagnetic sensor, an electromechanical sensor, an electrical attribute sensor, a transducer, or the like); a power control component; an analog component; a digital logic component; or any combination thereof. Using smart power integrated circuits, designers can reduce the size of the analog portion and the digital logic of practical applications to achieve dense circuitry. This enables designers to economically pack more features and capability into a chip, resulting in reduced die area, reduced cost, and improved performance. This integration helps designers of automotive systems, industrial controls, and consumer electronics simplify system design, lower system cost, and improve reliability.

Figure 3:
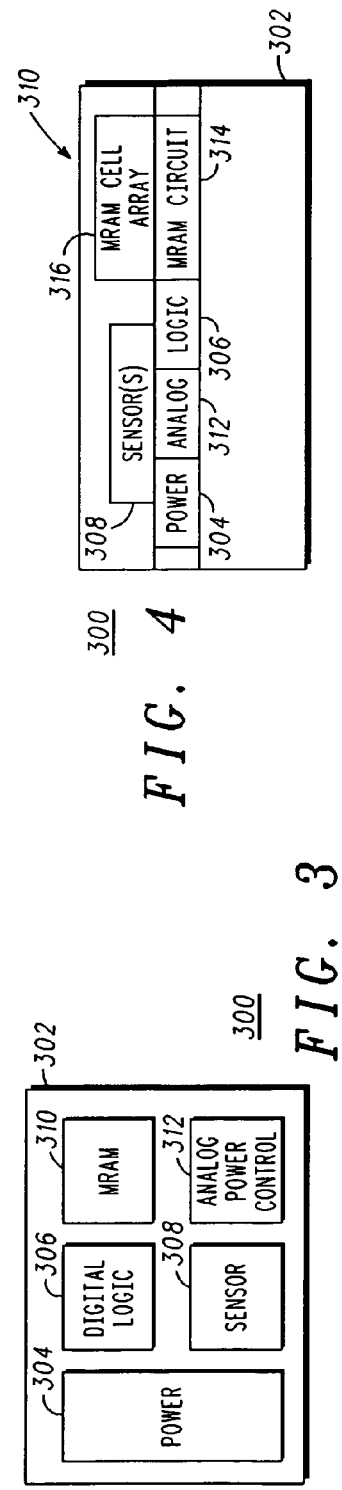
FIG. 3 is a schematic representation of an integrated circuit device configured in accordance with an example embodiment of the invention.

FIG. 3 is a schematic representation of an integrated circuit device 300 configured in accordance with an example embodiment of the invention. Integrated circuit device 300 generally includes a substrate 302 upon which a number of functional components are formed. Substrate 302 may be any suitable semiconductor material, such as a silicon-based material. The functional components are schematically depicted as blocks in FIG. 3 for ease of illustration. In this example, these functional components include a power circuit component 304, a digital logic component 306, a sensor architecture 308, an MRAM architecture 310, and an analog power control component 312. Although not shown in FIG. 3, integrated circuit device 300 may include additional components as necessary to satisfy the needs of the particular application. In practice, some of these functional components may be coupled together to enable cooperative operation. For example, power circuit component 304, digital logic component 306, sensor architecture 308, and analog power control component 312 may cooperate to form a smart power architecture for integrated circuit device 300. In this regard, these components (individually or in any combination thereof) are also referred to herein as "smart power components." MRAM architecture 310, however, need not be coupled to the other components and MRAM architecture 310 may be configured to function as an independent subsystem of integrated circuit device 300. The embedding of NRAM architecture 310 into a smart power integrated circuit in this manner results in an efficient use of physical space while enabling the fabrication of sensors from layers that are traditionally utilized only in connection with the MTJ core of an MRAM.

In one practical embodiment of the invention, power circuit component 304 includes one or more power MOSFET devices that are configured to operate at high voltages and high currents. Alternate embodiments may employ different power devices and techniques for power circuit component 304. Digital logic component 306 may be realized with CMOS transistors or any suitable digital logic arrangement. Digital logic component 306 is configured to carry out the digital operations that support the smart power architecture of integrated circuit device 300. Analog power control component 312 includes analog circuit components configured to support the smart power architecture of integrated circuit device 300. Analog power control component 312 may include, for example, resistors, capacitors, inductors, MOSFETs, bipolar devices, and/or other analog circuit elements.

Sensor architecture 308 is generally configured to sense one or more physical, electrical, magnetic, environmental, or other conditions for integrated circuit device 300. In this example, integrated circuit device 300 uses the quantity, characteristic, parameter, or phenomena detected by sensor architecture 308 to regulate, control, manage, or monitor the output power generated by power circuit component 304. In this regard, sensor architecture 308 may employ one or more sensors or sensor components, including, without limitation: an environmental condition sensor, such as a temperature sensor, a humidity sensor, a light sensor, a radiation sensor, or the like; an electromagnetic sensor; an electromechanical sensor, such as a transducer; a mechanical sensor, such as a vibration sensor, an accelerometer, a stress/strain sensor, or the like; a magnetic field sensor; or an electrical attribute sensor, such as a voltage sensor, a current sensor, an impedance or resistance sensor, a temperature sensor, a capacitance sensor, an inductance sensor, or the like.

Figure 4:
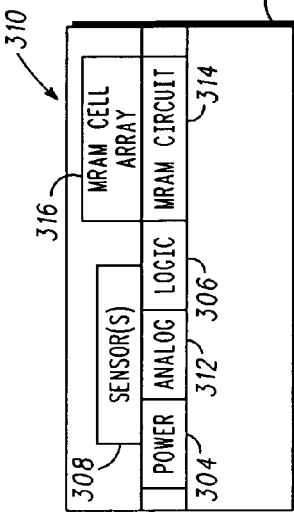
FIG. 4 is a schematic cross sectional representation of the integrated circuit device shown in FIG. 3.

MRAM architecture 310 may be generally configured as described above in connection with FIGS. 1 and 2. Indeed, integrated circuit device 300 may employ conventional MRAM designs and techniques for MRAM architecture 310, and such conventional features will not be described in detail herein. Generally, MRAM architecture 310 includes an MRAM circuit component 314 and an MRAM cell array 316 coupled to MRAM circuit component 314 (see FIG. 4, which is a schematic cross sectional representation of integrated circuit device 300). MRAM circuit component 314 may include any number of elements or features that support the operation of MRAM architecture 310, including, without limitation: switching transistors; input/output circuitry; a decoder; comparators; sense amplifiers, or the like. FIG. 4 is a simplified diagram that generally depicts the topological arrangement of the functional components of integrated circuit device 300. In this regard, FIG. 4 illustrates that MRAM architecture 310 is formed on substrate 302, and that the smart power architecture (including power circuit component 304, digital logic component 316, sensor architecture 308, and analog power control component 312 in this example) is formed on substrate 302. FIG. 4 also illustrates that MRAM cell array 316 is formed above MRAM circuit component 314.

In one exemplary embodiment of the invention, integrated circuit device 300 is manufactured using a modular process technology having a front end fabrication process and a back end fabrication process. In this context, the front end fabrication process is performed first in time and is completed before the back end process is initiated. As used herein, the front end fabrication process is associated with the formation of elements or features using "front end layers," which may be N and/or P doped regions within a semiconductor substrate 302, dielectric layers, or other layers, while the back end fabrication process is associated with the formation of elements or features using "back end layers," which may be metal or conductive layers, dielectric layers, MTJ core layers, or other layers. Thus, the front end layers are located in or on substrate 302, and the back end layers are located above the front end layers. In practice, the front end and back end fabrication processes may utilize well known masking, reactive ion etching, physical sputtering, damascene patterning, physical vapor deposition, electroplating, chemical vapor, and/or plasma enhanced chemical vapor deposition techniques. For example, an integrated circuit as described herein may be manufactured using a process technology that can leverage CMOS, bipolar, or other suitable fabrication processes.

FIG. 4 is a simplified diagram of components and elements of integrated circuit device 300 configured in accordance with an example embodiment of the invention. A practical embodiment of integrated circuit device 300 may include additional layers (e.g., metal layers, dielectric layers, and/or a ground plane) than that shown in FIG. 4. In this example, power circuit component 304, analog power control component 312, digital logic component 306, and MRAM circuit component 314 are suitably formed by the front end fabrication process from front end layers. Some or all of these front end components may be concurrently formed by the front end fabrication process. In contrast, sensor architecture 308 (which may include one or more sensors) and MRAM cell array 316 are suitably formed by the back end fabrication process from back end layers. Some or all of these back end components may be concurrently formed by the back end fabrication process. In practice, the front end and back end fabrication processes are modules in the MRAM fabrication process employed to create MRAM architecture 310. Thus, the manufacture of integrated circuit device 300 leverages the existing MRAM fabrication process for purposes of the smart power architecture. In this manner, at least a portion of the smart power architecture and at least a portion of MRAM architecture 310 can be concurrently formed by the chosen MRAM fabrication process.

Figure 5:
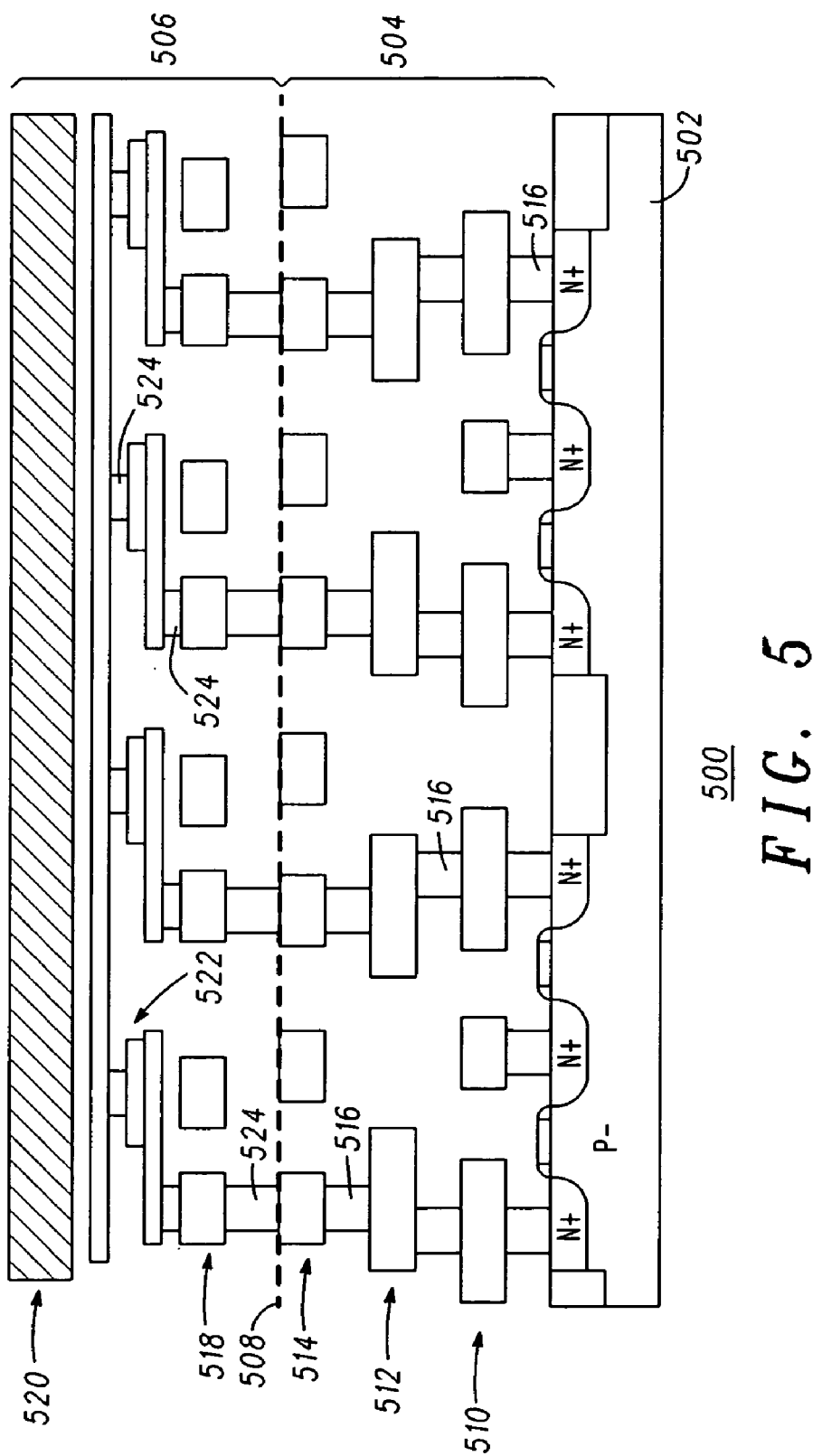
FIG. 5 is a schematic cross sectional representation of an integrated circuit device configured in accordance with an example embodiment of the invention.

FIG. 5 is a schematic cross sectional representation of an integrated circuit device 500 configured in accordance with an example embodiment of the invention. Integrated circuit device 300 may employ the general structure depicted in FIG. 5. Integrated circuit device 500 represents an example MRAM embedded smart power integrated circuit fabricated in the manner described herein. Integrated circuit device 500 generally includes a substrate 502, front end layers formed in or on substrate 502, and first back end layers 504 and second back end layers 506 formed above the front end layers. A dashed line 508 in FIG. 5 represents an imaginary dividing line between the first back end fabrication process and the second back end fabrication process.

In one practical embodiment of the invention, first back end layers 504 of integrated circuit device 500 may include a metal-one layer 510, a metal-two layer 512, a metal-three layer 514, intervening dielectric layers (not separately shown in FIG. 5), conductive vias 516 routed between layers, and the like, while second back end layers 506 of integrated circuit device 500 may include a metal-four layer 518, a metal-five layer 520, an MTJ core "layer" 522, intervening dielectric layers (not separately shown in FIG. 5), conductive vias 524 routed between layers, and the like. As described above, an MTJ core may be realized by more than one layer of material. For the sake of simplicity, however, FIG. 5 depicts the MTJ core as a single "layer" 522. In other embodiments of the invention, integrated circuit device 500 might include more or less front end layers and/or more or less back end layers.

In the example embodiment, power circuit component 304, analog power control component 312, digital logic component 306, and MRAM circuit component 314 are formed using elements created from metal-one layer 510, metal-two layer 512, and/or metal-three layer 514, while sensor architecture 308 and MRAM cell array 316 are formed using elements created from metal-four layer 518, metal-five layer 520, and/or MTJ layer 522. MRAM cell array 316 includes a plurality of bit lines formed on metal-five layer 520, a plurality of digit lines formed on metal-four layer 518, and an array of MTJ cells (the MTJ core layer 522 forms the MTJ cells) formed between metal-four layer 518 and metal-five layer 520. In this example, sensor architecture 308 includes a sensor component that is also formed from MTJ core layer 522. In practice, this sensor component is created with the same back end fabrication process used for the creation of MRAM cell array 316. Sensor architecture 308 may also include an additional sensor component (not shown) that is formed from metal-four layer 518 and/or from metal-five layer 520. Such additional sensor components may represent conductive traces, control circuitry, biasing circuitry, or the like.

A sensor in sensor architecture 308 is suitably configured (along with cooperating circuitry or features if necessary) to suit the needs of the particular application. The sensor, which is fabricated from MTJ core layer 522, is designed such that variations in certain operating conditions cause a related change in the electrical, magnetic, electromagnetic, electromechanical, and/or other characteristics of the sensor. For example, an MTJ-based device could be configured to sense current flowing through a nearby conductor by its reaction to the magnetic field generated by the current flow. MTJ-based sensors may also have certain characteristics dependent on physical parameters, such as pressure and acceleration.

In summary, systems, devices, and methods configured in accordance with example embodiments of the invention relate to:

An integrated circuit device including a substrate, a magnetic random access memory ("MRAM") architecture formed on the substrate, the MRAM architecture comprising an MRAM circuit component formed from front end layers; an MRAM cell array formed from back end layers; and a smart power architecture formed on the substrate, the smart power architecture comprising a smart power component formed from the front end layers. The MRAM circuit component may be formed by a front end fabrication process, the MRAM cell array may be formed by a back end fabrication process, and the smart power component may be formed by the front end fabrication process. The smart power architecture may further comprise a sensor formed on the substrate and coupled to the smart power component, the sensor comprising a sensor component formed from the back end layers. The MRAM circuit component may be formed by a front end fabrication process, the MRAM cell array may be formed by a back end fabrication process, the smart power component may be formed by the front end fabrication process, and the sensor component may be formed by the back end fabrication process. The MRAM cell array may comprise at least one digit line formed from a first metal layer, at least one bit line formed from a second metal layer, and a magnetic tunnel junction core formed between the first metal layer and the second metal layer, and the sensor component being formed from the magnetic tunnel junction core. The sensor may comprise an additional sensor component formed from at least one of the first metal layer or the second metal layer. The sensor may comprise one or more of: an environmental condition sensor, an electromagnetic sensor, an electromechanical sensor, an electrical attribute sensor. The smart power component may comprise a power circuit component. The smart power component may comprise a power control component. The smart power component may comprise a digital logic component.

A method of forming an integrated circuit device, the method comprising: forming, on a substrate, a magnetic random access memory ("MRAM") circuit component by a front end fabrication process; forming, on the substrate, a smart power component by the front end fabrication process; forming, on the substrate, an MRAM cell array by a back end fabrication process; and forming, on the substrate, a sensor component by the back end fabrication process. Forming the MRAM cell array may comprise forming a magnetic tunnel junction core, and the sensor component may be formed from the magnetic tunnel junction core. The MRAM circuit component and the smart power component may be formed concurrently by the front end fabrication process. The MRAM cell array and the sensor component or other analog component may be formed concurrently by the back end fabrication process. Forming the MRAM cell array may comprise forming at least one digit line from a first metal layer, and forming at least one bit line from a second metal layer; and the method may further comprise forming an additional sensor component from at least one of the first metal layer or the second metal layer.

An integrated circuit device comprising: a substrate; a magnetic random access memory ("MRAM") architecture formed on the substrate by an MRAM fabrication process; and a smart power architecture formed on the substrate, at least a portion of the smart power architecture being formed by the MRAM fabrication process. At least a portion of the smart power architecture and at least a portion of the MRAM architecture may be concurrently formed by the MRAM fabrication process. The smart power architecture may comprise a smart power component and a sensor coupled to the smart power component, the smart power component may be formed by a front end fabrication process of the MRAM fabrication process, and the sensor may be formed by a back end fabrication process of the MRAM fabrication process. The MRAM architecture may comprise an MRAM circuit component formed by the front end fabrication process, and an MRAM cell array formed by the back end fabrication process. The MRAM cell array may comprise a magnetic tunnel junction core formed by the back end process, and the sensor may be formed by the magnetic tunnel junction core.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. An integrated circuit device comprising:
    a substrate;
    a magnetic random access memory ("MRAM") architecture formed on said substrate, said MRAM architecture comprising:
        an MRAM circuit component formed from front end layers;
        an MRAM cell array formed from back end layers; and
    a smart power architecture formed on said substrate, said smart power architecture comprising a smart power component formed from said front end layers.

2. An integrated circuit device according to claim 1, said MRAM circuit component being formed by a front end fabrication process, said MRAM cell array being formed by a back end fabrication process, and said smart power component being formed by said front end fabrication process.

3. An integrated circuit device according to claim 1, said smart power architecture further comprising a sensor formed on said substrate and coupled to said smart power component, said sensor comprising a sensor component formed from said back end layers.

4. An integrated circuit device according to claim 3, said MRAM circuit component being formed by a front end fabrication process, said MRAM cell array being formed by a back end fabrication process, said smart power component being formed by said front end fabrication process, and said sensor component being formed by said back end fabrication process.

5. An integrated circuit device according to claim 3, said MRAM cell array comprising at least one digit line formed from a first metal layer, at least one bit line formed from a second metal layer, and a magnetic tunnel junction core formed between said first metal layer and said second metal layer, and said sensor component being formed from said magnetic tunnel junction core.

6. An integrated circuit device according to claim 5, said sensor comprising an additional sensor component formed from at least one of said first metal layer or said second metal layer.

7. An integrated circuit device according to claim 3, said sensor comprising one or more of: an environmental condition sensor, an electromagnetic sensor, an electromechanical sensor, an electrical attribute sensor.

8. An integrated circuit device according to claim 1, said smart power component comprising a power circuit component.

9. An integrated circuit device according to claim 1, said smart power component comprising a power control component.

10. An integrated circuit device according to claim 1, said smart power component comprising a digital logic component.

11. An integrated circuit device comprising:
    a substrate;
    a magnetic random access memory ("MRAM") architecture formed on said substrate by an MRAM fabrication process; and
    a smart power architecture formed on said substrate, at least a portion of said smart power architecture being formed by said MRAM fabrication process, said smart power architecture comprising a smart power component and a sensor coupled to said smart power component, said smart power component being formed by a front end fabrication process of said MRAM fabrication process, and said sensor being formed by a back end fabrication process of said MRAM fabrication process.

12. An integrated circuit according to claim 11, said at least a portion of said smart power architecture and at least a portion of said MRAM architecture being concurrently formed by said MRAM fabrication process.

13. An integrated circuit according to claim 11, said MRAM architecture comprising an MRAM circuit component formed by said front end fabrication process, and an MRAM cell array formed by said back end fabrication process.

14. An integrated circuit according to claim 13, said MRAM cell array comprising a magnetic tunnel junction core formed by said back end process, and said sensor being formed by said magnetic tunnel junction core.

* * * * *